(12) United States Patent
Hung et al.

(10) Patent No.: US 10,700,177 B2
(45) Date of Patent: Jun. 30, 2020

(54) SEMICONDUCTOR DEVICE WITH LOW RESISTIVITY CONTACT STRUCTURE AND METHOD FOR FORMING THE SAME

(71) Applicant: Taiwan Semiconductor Manufacturing Co., Ltd., Hsinchu (TW)

(72) Inventors: Min-Hsiu Hung, Tainan (TW); Yi-Hsiang Chao, New Taipei (TW); Kuan-Yu Yeh, Taoyuan (TW); Kan-Ju Lin, Kaohsiung (TW); Chun-Wen Nieh, Zhubei (TW); Huang-Yi Huang, Hsinchu (TW); Chih-Wei Chang, Hsinchu (TW); Ching-Hwanq Su, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 10 days.

(21) Appl. No.: 15/964,352

(22) Filed: Apr. 27, 2018

(65) Prior Publication Data
US 2019/0097012 A1 Mar. 28, 2019

Related U.S. Application Data

(60) Provisional application No. 62/563,795, filed on Sep. 27, 2017.

(51) Int. Cl.
*H01L 29/45* (2006.01)
*H01L 21/768* (2006.01)
(Continued)

(52) U.S. Cl.
CPC ............ *H01L 29/45* (2013.01); *H01L 21/321* (2013.01); *H01L 21/32053* (2013.01);
(Continued)

(58) Field of Classification Search
CPC ... H01L 29/665; H01L 29/6659; H01L 29/45; H01L 21/28518; H01L 21/0206; H01L 21/32053
See application file for complete search history.

(56) References Cited

U.S. PATENT DOCUMENTS 8,772,109 B2    7/2014   Colinge
8,785,285 B2    7/2014   Tsai et al.
(Continued)

*Primary Examiner* — Zandra V Smith
*Assistant Examiner* — John M Parker
(74) *Attorney, Agent, or Firm* — McClure, Qualey & Rodack, LLP

(57) ABSTRACT

A method for forming a semiconductor device structure is provided. The method includes providing a semiconductor substrate including a conductive region made of silicon, germanium or a combination thereof. The method also includes forming an insulating layer over the semiconductor substrate and forming an opening in the insulating layer to expose the conductive region. The method also includes performing a deposition process to form a metal layer over a sidewall and a bottom of the opening, so that a metal silicide or germanide layer is formed on the exposed conductive region by the deposition process. The method also includes performing a first in-situ etching process to etch at least a portion of the metal layer and forming a fill metal material layer in the opening.

20 Claims, 9 Drawing Sheets

(51) Int. Cl.
*H01L 29/66* (2006.01)
*H01L 29/417* (2006.01)
*H01L 29/78* (2006.01)
*H01L 21/3213* (2006.01)
*H01L 21/3205* (2006.01)
*H01L 21/321* (2006.01)
*H01L 21/306* (2006.01)
*H01L 29/08* (2006.01)

(52) U.S. Cl.
CPC .. *H01L 21/32135* (2013.01); *H01L 21/32136* (2013.01); *H01L 21/76802* (2013.01); *H01L 21/76843* (2013.01); *H01L 21/76856* (2013.01); *H01L 21/76865* (2013.01); *H01L 21/76877* (2013.01); *H01L 21/76889* (2013.01); *H01L 21/76897* (2013.01); *H01L 29/41791* (2013.01); *H01L 29/665* (2013.01); *H01L 29/66795* (2013.01); *H01L 29/7851* (2013.01); *H01L 21/30604* (2013.01); *H01L 21/3212* (2013.01); *H01L 21/7684* (2013.01); *H01L 29/0847* (2013.01); *H01L 29/41783* (2013.01); *H01L 29/66636* (2013.01); *H01L 29/7848* (2013.01)

(56) References Cited

U.S. PATENT DOCUMENTS

| | | | |
|---|---|---|---|
| 8,816,444 B2 | 8/2014 | Wann et al. | |
| 8,823,065 B2 * | 9/2014 | Wang | H01L 23/485 257/288 |
| 8,860,148 B2 | 10/2014 | Hu et al. | |
| 9,105,490 B2 | 8/2015 | Wang et al. | |
| 9,230,795 B1 * | 1/2016 | Wang | H01L 21/26586 |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2004/0074515 A1 * | 4/2004 | Kim | C23C 16/0245 134/1.1 |
| 2006/0030116 A1 * | 2/2006 | Moon | H01L 21/76889 438/386 |

* cited by examiner

SEMICONDUCTOR DEVICE WITH LOW RESISTIVITY CONTACT STRUCTURE AND METHOD FOR FORMING THE SAME

CROSS REFERENCE TO RELATED APPLICATIONS

This application claims the benefit of U.S. Provisional Application No. 62/563,795 filed on Sep. 27, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over three sides (e.g., wrapping) the fin. Advantages of the FinFET may include reducing the short channel effect and raising the current flow.

Although existing FinFETs and methods of fabricating FinFETs have been generally adequate for their intended purposes, they have not been entirely satisfactory in all respects. For example, as the size of FinFET device structure has been reduced, problems (e.g., poor step coverage, opening overhang, void formation, and increased contact resistance) may occur when contact metal materials are filled into contact openings (e.g., vias or trenches) with small critical dimension (CD). Therefore, it is a challenge to form reliable contact structures at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
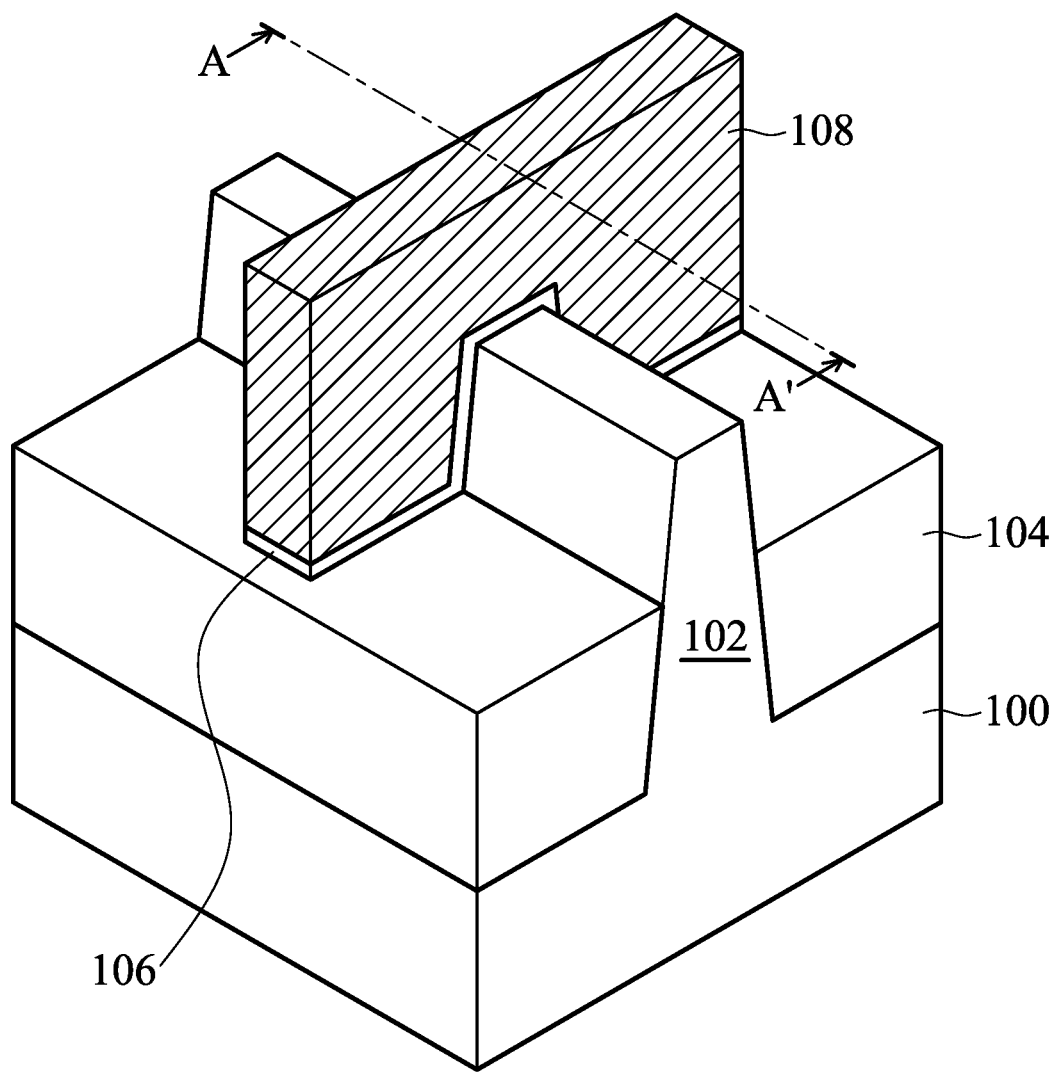
FIG. 1 is schematic an intermediate semiconductor device structure with a fin in a three-dimensional view in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of a semiconductor device structure and a method for forming a semiconductor device structure are provided. FIG. 1 is a schematic three-dimensional view showing a semiconductor device structure with a fin in accordance with some embodiments. As shown in FIG. 1, the semiconductor device structure, such as a FinFET structure includes a semiconductor substrate 100, which may be, for example, a part of a wafer. In some embodiments, the semiconductor substrate 100 includes a semiconductor material (e.g., silicon). In some other embodiments, the semiconductor substrate 100 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP, or a combination thereof. Alternatively, the semiconductor substrate 100 is a semiconductor on insulator (SOI).

In some embodiments, the semiconductor substrate 100 includes at least a fin 102 formed therein. The fin 102 may be formed in the semiconductor substrate 100 by etching trenches in the semiconductor substrate 100. The etching may be a reactive ion etching (RIE), neutral beam etching (NBE), the like, or a combination thereof. In some embodiments, the fin 102 may include silicon, silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. A person of ordinary skill in the art will readily understand other methods of forming the fin, which are contemplated within the scope of some embodiments.

In some embodiments, the semiconductor device structure further includes isolation regions may be positioned on opposite sides of the fin 102. In some embodiments, each of the isolation regions includes an isolation feature 104 and a liner structure (not shown) covering the sidewall and the bottom of the isolation feature 104, so that the semiconductor substrate 100 and the lower portion of the fin 102 are spaced apart from the isolation features 104 by the liner structures.

In some embodiments, the isolation feature 104 is made of a dielectric material, such as silicon oxide, fluoride-doped silicate glass (FSG), a low-k dielectric material, and/or another suitable insulating material. The isolation features 104 may be shallow trench isolation (STI) features. In some embodiments, the liner structure may include a single layer or a multiple structure and may be made of silicon oxide, silicon nitride, silicon oxynitride, silicon carbide (SiC), or a combination thereof.

In some embodiments, the semiconductor device structure further includes a gate structure positioned over the semiconductor substrate 100. The gate structure may be across the fin 102. In some embodiments, the gate structure may include a gate dielectric layer, a gate electrode layer, and/or one or more additional layers (not shown). For example, the gate structure may include an interfacial layer (not shown), a gate dielectric layer 106 and a gate electrode layer 108 including work function layer(s) and a fill metal layer. In some embodiments, the interfacial layer may include a dielectric material such as silicon oxide layer ($SiO_2$) or silicon oxynitride (SiON). The gate dielectric layer 106 may include silicon dioxide or another suitable dielectric material. Alternatively, the gate dielectric layer 106 may include a high-k dielectric layer such as $HfO_2$, $TiO_2$, HfZrO, $Ta_2O_3$, $HfSiO_4$, $ZrO_2$, $ZrSiO_2$, or a combination thereof. An exemplary p-type work function metal may include TiN, TaN, Ru, Mo, Al, WN, $ZrSi_2$, $MoSi_2$, $TaSi_2$, $NiSi_2$, WN, or a combination thereof. An exemplary n-type work function metal may include Ti, Ag, TaAl, TaAlC, TiAlN, TaC, TaCN, TaSiN, Mn, Zr, or a combination thereof. The fill metal layer may be made of a metal-containing material such as TiN, TaN, TaC, Co, Ru, Al, combinations thereof, or multi-layers thereof.

Although not depicted, a P well or an N well may be formed in various regions of the semiconductor substrate 100 by, for example, an ion implantation process followed by an annealing process. In some embodiments, a p-type impurity implantation may be performed in the NFET region. The p-type impurities may be boron, $BF_2$, implanted in the NFET region to a concentration between about $10^{15}$ $cm^{-3}$ and about $7 \times 10^{18}$ $cm^{-3}$. An n-type impurity implant may be performed in the PFET region. The n-type impurities may be phosphorus or arsenic, implanted in the PFET region to a concentration between about $10^{15}$ $cm^{-3}$ and about $7 \times 10^{18}$ $cm^{-3}$. The implantations may form a p-well in the NFET region or an n-well in the PFET region.

Figure 2:
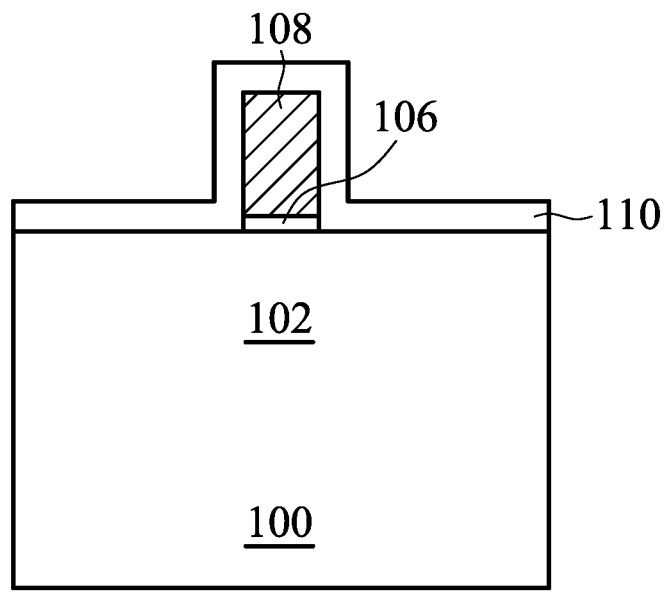
FIGS. 2, 3, 4, 5, 6, 7, 8, 9, 10, 11, and 12 are cross-sectional views of various intermediate stages showing a method of forming the semiconductor device structure with a fin taken along line A-A' in FIG. 1 in accordance with some embodiments.

FIGS. 2, 3, 4, 5, 6, 7, 8, 9, 10, 11, and 12 are cross-sectional views of various intermediate stages showing a method of forming the semiconductor device structure with a fin taken along line A-A' in FIG. 1 in accordance with some embodiments. As shown in FIG. 2, a spacer layer 110 is conformally formed over the intermediate semiconductor device structure in FIG. 1 in accordance with some embodiments. The spacer layer 110 is illustrated as being conformally over the surface of the fin 102 and along sidewalls and a top surface of the gate structure including the gate electrode 108. In some embodiments, the spacer layer 110 may be silicon nitride (SiN), silicon carbon-nitride (SiCN), silicon carbon-oxynitride (SiCON), the like, or a combination thereof, formed by a deposition process, such as a chemical vapor deposition (CVD) process, an atomic layer deposition (ALD) process, the like, or a combination thereof.

Figure 3:
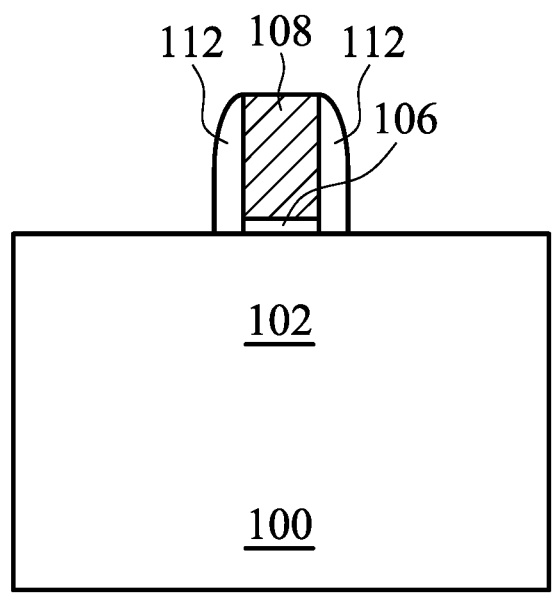

As shown in FIG. 3, an anisotropical etching process is performed on the spacer layer 110 shown in FIG. 2 in accordance with some embodiments. As a result, spacers 112 are formed on opposite sidewalls of the gate structure, e.g., at least adjacent to the gate electrode 108. In some embodiments, the etching process may be a reactive ion etching (RIE) process, an inductively coupled plasma (ICP) etching process, a transformer coupled plasma (TCP) etching process, a high density plasma (HDP) etching process, an electron cyclotron resonance (ECR) etching process, the like, or a combination thereof.

Figure 4:
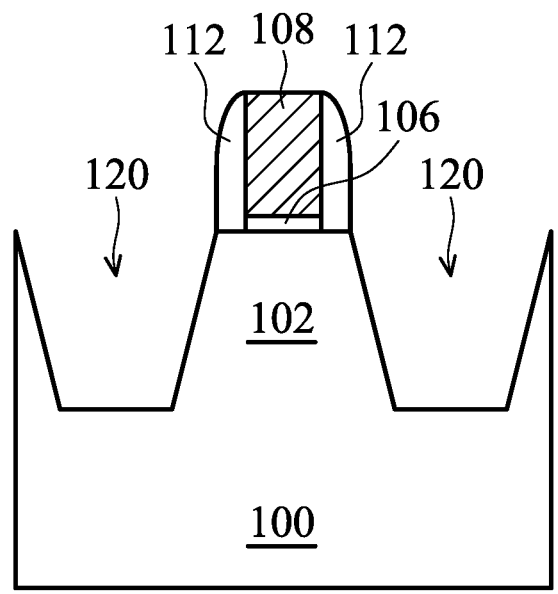

As shown in FIG. 4, portions of the fin 102 uncovered by the spacers 112 and the gate structure including the gate dielectric layer 106 and the gate electrode layer 108 are etched in accordance with some embodiments. For example, the portions of the fin 102 are etched using an isotropic etching process, such as a wet etching process. In some embodiments, the wet etching process may use hydrofluoric (HF) acid, buffered oxide etch (BOE), or the like as an etchant. In other embodiments, multiple etch process steps comprising different etchants may be used. After the isotropic etching process is performed, recesses 120 are formed in the fin 102 on opposite sides of the gate structure. The depth of the recess 120 may be between about 5 nm and about 150 nm from the original top surface of the fin 102 to an upper surface of a remaining portion of the fin 102.

Figure 5:
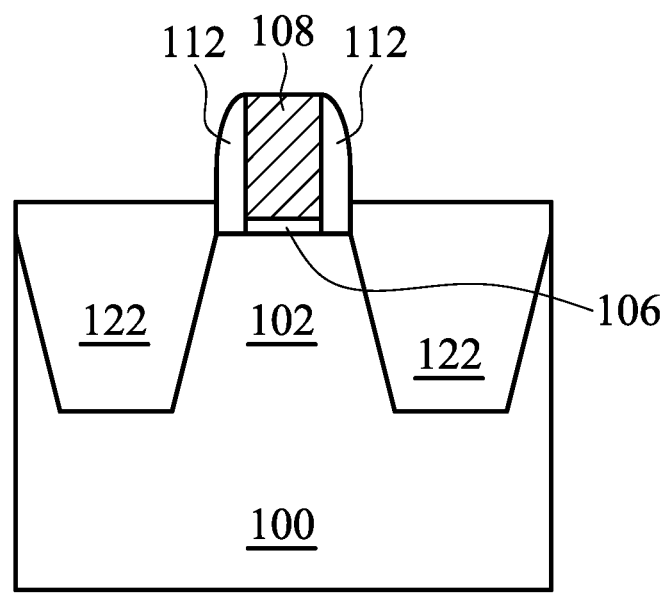

As shown in FIG. 5, a conductive region 122 is formed in each of the recesses 120 shown in FIG. 4 in accordance with some embodiments. For example, an epitaxial growth process is performed to form the conductive regions 122 in the recesses 120. In some embodiments, the conductive regions 122 serve as source/drain regions and sometimes are referred to as raised epitaxial source/drain regions. The conductive regions 122 (i.e., raised epitaxial source/drain regions) are grown from the upper surfaces of the remaining portions of the fin 102 in the recesses 120 and above the recesses 102.

In some embodiments, the raised epitaxial source/drain regions (i.e., the conductive region 122) may be made of silicon, germanium, silicon germanium, silicon carbide, indium phosphide (InP), gallium arsenide (GaAs), the like, or a combination thereof. In some embodiments, the raised epitaxial source/drain regions (i.e., the conductive region 122) may be formed using metal-organic CVD (MOCVD), molecular beam epitaxy (MBE), liquid phase epitaxy (LPE), vapor phase epitaxy (VPE), selective epitaxial growth (SEG), the like, or a combination thereof. In some embodiments, the raised epitaxial source/drain regions (i.e., the conductive region 122) may be doped by in-situ doping during growth and/or subsequent implantation. In those cases, the raised epitaxial source/drain regions may have a doping concentration of greater than or equal to $5 \times 10^{19}$ cm$^{-3}$. The dopants for a p-type transistor may include boron, indium, or the like, and those for an n-type transistor may include phosphorus, arsenic, or the like.

Figure 6:
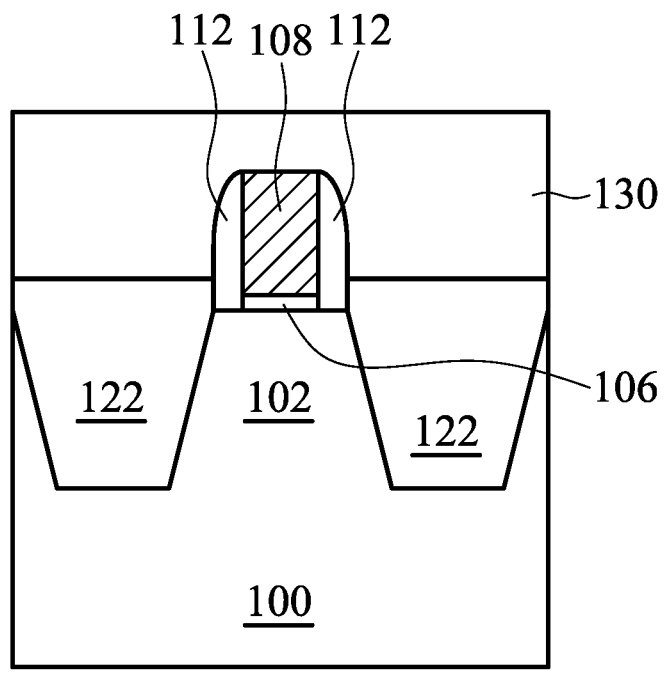

As shown in FIG. 6, an insulating layer 130 is formed over the structure illustrated in FIG. 5 in accordance with some embodiments. In some embodiments, the insulating layer 130 is an inter-layer dielectric (ILD) layer that may be formed of a dielectric material such as silicon oxide, tetra-ethyl orthosilicate (TEOS), phosphosilicate glass (PSG), borosilicate glass (BSG), boron-doped phosphosilicate Glass (BPSG), fluorinated silicate glass (FSG), undoped silicate glass (USG), or the like, and may be deposited by any suitable method, such as CVD, plasma enhanced CVD (PECVD), flowable CVD (FCVD), the like, or a combination thereof. In some embodiments, ILD layer may be a single layer or include multiple dielectric layers with the same or different dielectric materials. Moreover, the ILD layer has a thickness in a range from about 4000 Å to about 8000 Å.

Figure 7:
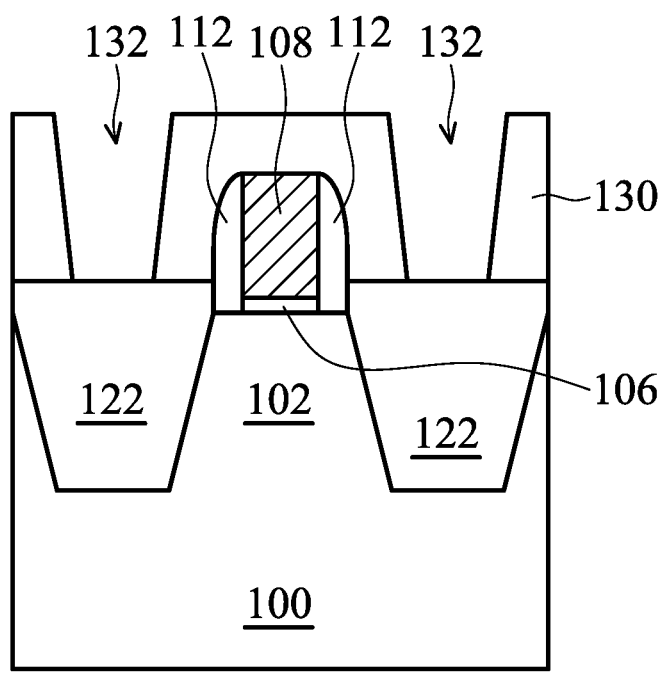

As shown in FIG. 7, contact openings 132 (such as via holes or trenches) are formed in the insulating layer 130 to expose the corresponding conductive regions 122 (i.e., the raised epitaxial source/drain regions) in accordance with some embodiments. As one example, the formation of the contact openings 132 includes forming a photoresist layer (not shown) over the insulating layer 130 (i.e., the ILD layer) by a suitable process, such as spin-on coating, patterning the layer of photoresist to form a patterned photoresist feature by a proper photolithography method, etching the exposed insulating layer 130 (for example, by a dry etching, wet etching, and/or plasma etching process) to remove portions of the insulating layer 130 to expose a portion of the raised epitaxial source/drain regions (i.e., the conductive regions 122). In some embodiments, the etching is a wet etching that uses a dilute HF (DHF) acid, BOE, phosphoric acid ($H_3PO_4$), or the like as an etchant. As a result, the contact openings 132 are over the raised epitaxial source/drain regions. The etching may remove at least a portion of the raised epitaxial source/drain regions (i.e., the conductive regions 122), and hence, more surface area of the raised epitaxial source/drain regions may be exposed. The patterned photoresist layer may be stripped thereafter.

Figure 8:
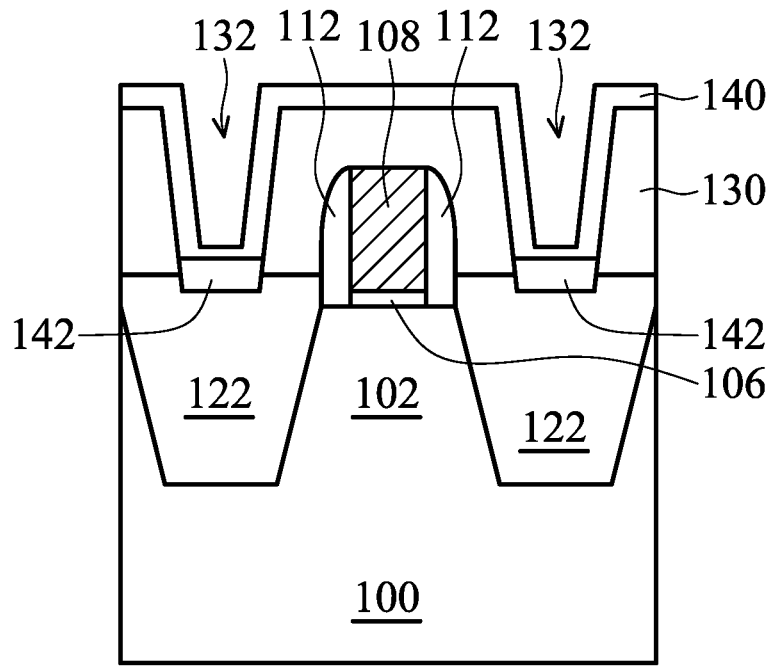

As shown in FIG. 8, after formation of the contact openings 132 in the insulating layer 130 (i.e., the ILD layer), the structure in FIG. 8 is produced by performing a deposition process to form a conformal metal layer 140 over a sidewall and a bottom of each of the contact openings 132 in accordance with some embodiments. In some embodiments, the metal layer 140 may be formed of Ti, Al, Zr, Hf, Ta, Co, Ni, Y, and may be formed by, for example, a CVD, ALD or electrochemical plating (ECP) process. In some embodiments, the deposition process is performed at a temperature lower than 600° C. in order to form silicide or germanide. For example, the deposition process is performed at a temperature of about 350° C. to about 500° C. If the process temperature less than 350° C., precursor or by-product will be the residual on wafer. Moreover, the used power for the deposition process may be in a range from about 150 W to about 1500 W. While the deposition process is being performed, the metal layer 140 reacts with the semiconductor material of the exposed the conductive regions 122 (i.e., the raised epitaxial source/drain regions), so as to form a metal silicide or germanide layer 142 on each of the exposed the conductive regions 122. That is, the metal silicide or germanide layer 142 is formed due to the deposition process. Therefore, after performing the deposition process, no annealing process is needed for formation of the metal silicide or germanide on the exposed epitaxial source/drain regions. Due to the formation of the metal silicide or germanide layer 142, the thickness of the metal layer 140 over the sidewall of the opening 132 is greater than that of the metal layer 140 over the bottom of the contact opening 132, as shown in FIG. 8. The deposition including CVD, ALD or ECP provides excellent step coverage in the contact opening 132, so as to increase the contact area between the metal layer 140 and the exposed conductive region 122. As a result, the contact resistance between the conductive region 122 and the subsequently formed fill metal material layer is reduced.

Figure 9:
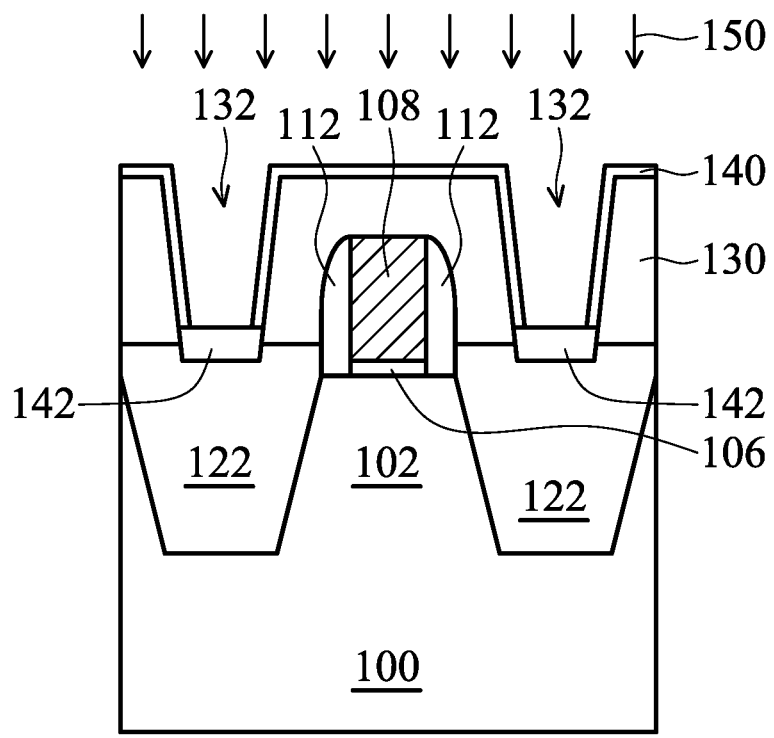

As shown in FIG. 9, after the metal layer 140 is formed, an in-situ etching process 150 is performed to etch back at least a portion of the metal layer 140 in accordance with some embodiments. In some embodiments, the in-situ etching process 150 is a dry etching process using a metal halide as a process gas. For example, the metal layer 140 is made of titanium (Ti), and the process gas includes titanium tetrachloride ($TiCl_4$), titanium tetrafluoride ($TiF_4$), titanium tetrabromide ($TiBr_4$) or titanium tetraiodide ($TiI_4$). In this case, the flow rate of metal halide is in a range from about 2 sccm to about 50 sccm depending on the deposition rate. Moreover, plasma power is sometimes applied when the in-situ etching process 150 is performed. For an example, the plasma power is substantially equal to or less than 300 W. In some embodiments, the process gas for the in-situ etching process 150 may further include hydrogen ($H_2$) and the flow rate of hydrogen is substantially equal to or less than 50 sccm.

After the in-situ etching process 150 is performed, the metal layer 140 on the sidewall of the contact opening 132 is thinned, so that the critical dimension (CD) loss of the contact opening 132 due to the formation of the metal layer 140 is mitigated. That is, the opening overhang or the void formation during the subsequent metal filling process can be eliminated or mitigated. Since the thickness of the metal layer 140 on the sidewall of the contact opening 132 is greater than that of the metal layer 140 on the bottom of the contact opening 132, the portion of the metal layer 140 on the bottom of the contact opening 132 may be entirely removed after the in-situ etching process 150 is performed, such that the metal silicide or germanide layer 142 is exposed, as shown in FIG. 9.

In some other embodiments, after the in-situ etching process 150 is performed, an optional second in-situ etching process (not shown) is performed, so that the etched metal layer 140 is thinned further. In those cases, the second in-situ etching process is similar to the previous in-situ etching process 150. For example, the second in-situ etching process is also performed using metal halide and hydrogen as a process gas, in which the flow rate of metal halide may be in a range from about 10 sccm to 50 sccm and the flow rate of hydrogen may be in a range from about 10 sccm to 500 sccm. Unlike the previous in-situ etching process 150, the second in-situ etching process is performed without applying plasma power. After the second in-situ etching process is performed, the etched metal layer 140 shown in FIG. 9 may be entirely etched or removed.

Figure 10:
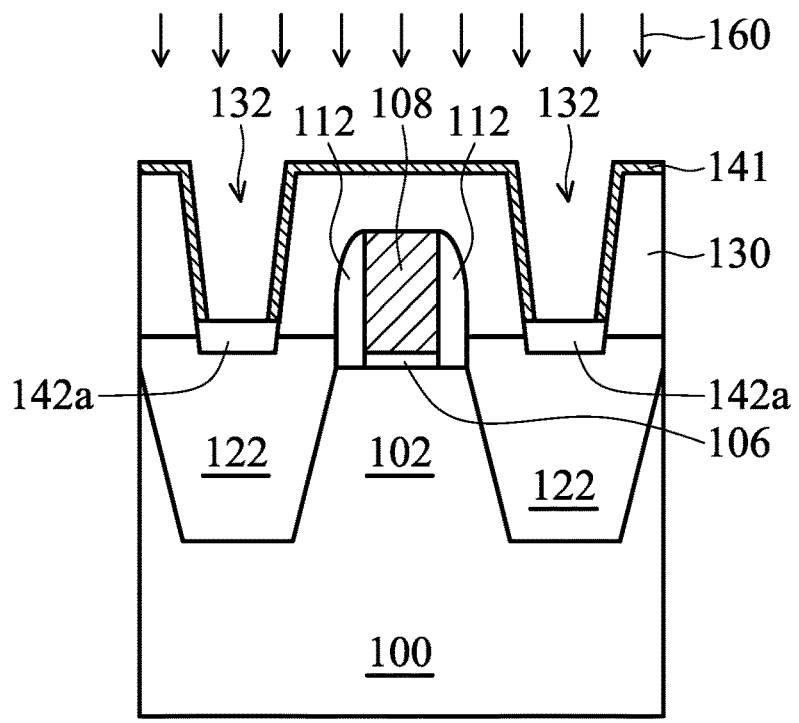

As shown in FIG. 10, after the in-situ etching process 150 is performed, an in-situ nitridation treatment 160 is performed on the sidewall and the bottom of the contact opening 132 in accordance with some embodiments. As a result, a nitrogen-containing metal silicide or germanide layer 142a is formed over the bottom of each of the contact openings 132 by performing the in-situ nitridation treatment 160 on the metal silicide or germanide layer 142 shown in FIG. 9. At the same time, a liner 141 including a metal nitride region is formed over the sidewall of each of the contact openings 132 by performing the in-situ nitridation treatment 160 on the etched metal layer 140 shown in FIG. 9.

In some embodiments, the metal nitride region is formed on the surface of the etched metal layer 140 shown in FIG. 9, so that the liner 141 includes a metal (e.g., Ti) portion in direct contact with the sidewall of the contact openings 132. In some embodiments, the etched metal layer 140 shown in FIG. 9 is entirely nitrided, such that the entire liner 141 forms a metal nitride (e.g., TiN) region, as shown in FIG. 10. The formed liner 141 may serve as an adhesion layer, a diffusion barrier layer, and an oxygen blocking layer for subsequent metal filling process.

In some embodiments, the in-situ nitridation treatment 160 is performed at a temperature of about 350° C. to about 500° C. for 30 sec to 300 sec. Moreover, the in-situ nitridation treatment 160 is performed using ammonia ($NH_3$) and nitrogen ($N_2$) as a process gas.

Figure 11:
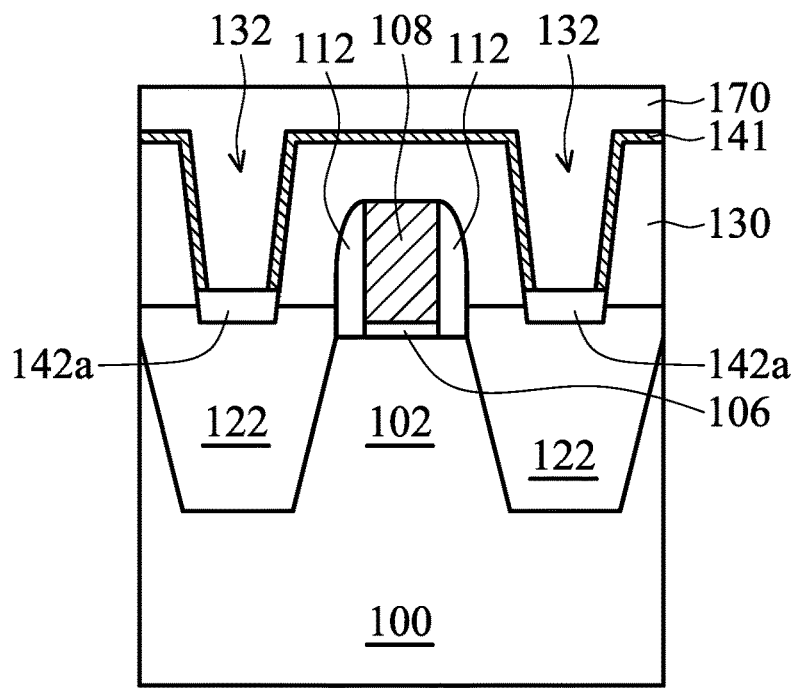

As shown in FIG. 11, following formation of the liner 141, a fill metal material layer 170 covers the liner 141 above the insulating layer 130 and fills the contact openings 132 to cover the liner 141 and the nitrogen-containing metal silicide or germanide layer 142a in each of the contact openings 132 in accordance with some embodiments. As a result, the liner 141 is interposed between the insulating layer 130 and the sidewall of the fill metal material layer 170. Moreover, the nitrogen-containing metal silicide or germanide layer 142a is interposed between the bottom of the fill metal material layer 170 and the top of the conductive regions 122 (i.e., the raised epitaxial source/drain regions). In some embodiments, the fill metal material layer 170 is made of cobalt (Co), tungsten (W), copper (Cu), nickel (Ni), or aluminum (Al). In some embodiments, the fill metal material layer 170 is formed by a deposition process, such as CVD, ECP, ALD, or other suitable deposition. The fill metal material layer 170 is thus deposited until each of the contact openings 132 is substantially filled or over-filled.

Figure 12:
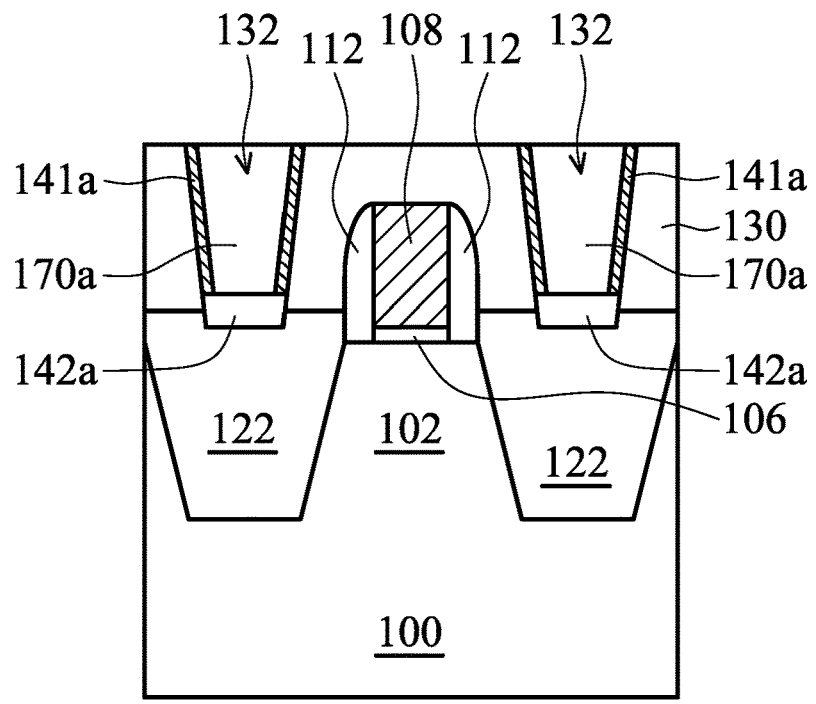

As shown in FIG. 12, a planarization process is performed on the fill metal material layer 170 shown in FIG. 11 in accordance with some embodiments. In some embodiments, the fill metal material layer 170 is planarized by a chemical-mechanical planarization (CMP) process, but any other suitable polishing or etching back process may be used. The planarization process removes a portion of the fill metal material layer 170 and a portion of the liner 141 outside of the contact opening 132 and stops when reaching the insulating layer 130, so as to provide a substantially planar surface. After the planarization process is performed, the remaining liner 141a and the remaining fill metal material layer 170a in each of the contact openings 132 form a contact structure over the conductive region 122 (i.e., raised epitaxial source/drain region).

Following the formation of the contact structures in the contact openings 132, dielectric layers, such as inter-metal dielectric (IMD) layers, which may include metallization patterns, and any corresponding etch stop layers, may be formed over the insulating layer (i.e., the ILD layer) 130. A person of ordinary skill in the art will understand the additional processing that the structures in the figures may undergo, and hence, explicit discussion thereof is omitted herein for brevity.

Figure 13:
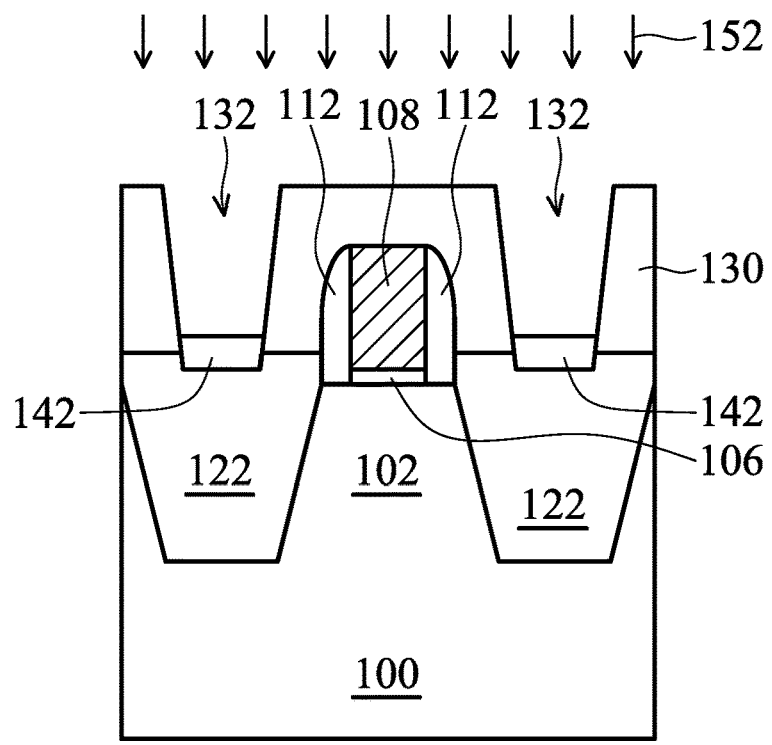
FIGS. 13, 14, and 15 are cross-sectional views of various intermediate stages showing a method of forming the semiconductor device structure with a fin in accordance with some embodiments.
Figure 14:
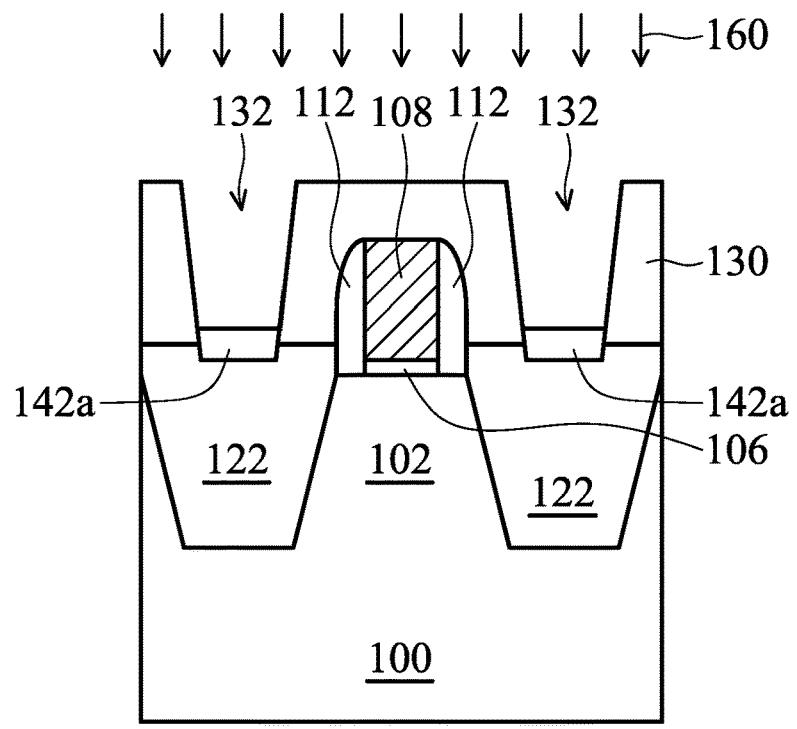
Figure 15:
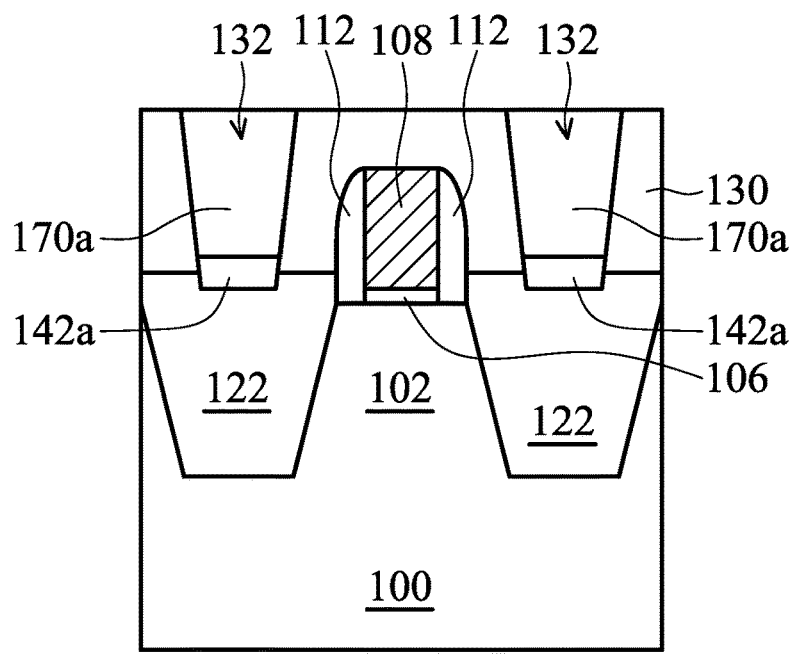

FIGS. 13, 14, and 15 are cross-sectional views of various intermediate stages showing a method of forming the semiconductor device structure with a fin in accordance with some embodiments. Elements in FIGS. 13, 14, and 15 that are the same as those in FIGS. 2, 3, 4, 5, 6, 7, 8, 9, 10, 11, and 12 are labeled with the same reference numbers as in FIGS. 2, 3, 4, 5, 6, 7, 8, 9, 10, 11, and 12 and may not be described again for brevity. As shown in FIG. 13, a structure as shown in FIG. 8 is provided and an in-situ etching process 152 is then performed to entirely remove the metal layer 140 in accordance with some embodiments. In some embodiments, the in-situ etching process 152 is similar to the in-situ etching process 150 shown in FIG. 9. For example, the in-situ etching process 152 is also performed using metal halide and hydrogen as a process gas, in which the flow rate of metal halide may be in a range from about 10 sccm to about 50 sccm and the flow rate of hydrogen may be in a range from about 10 sccm to about 500 sccm. Unlike the in-situ etching process 150, the in-situ etching process 152 is performed without applying plasma power.

After the in-situ etching process 152 is performed, the metal layer 140 in the structure as shown in FIG. 8 may be entirely etched or removed, as shown in FIG. 13. For an example, the metal layer 140 is made of titanium (Ti), and the metal halide in the process gas for the in-situ etching process 152 includes $TiCl_4$, $TiF_4$, $TiBr_4$ or $TiI_4$. In those cases, since the metal layer 140 is entirely removed after the in-situ etching process 152 is performed, the CD loss of the contact opening 132 due to the formation of the metal layer 140 may be mitigated.

As shown in FIG. 14, after the in-situ etching process 152 is performed, an optional in-situ nitridation treatment 160 is performed on the sidewall and the bottom of the contact opening 132 in accordance with some embodiments. As a result, a nitrogen-containing metal silicide or germanide layer 142a is formed over the bottom of each of the contact openings 132. In some embodiments, the in-situ nitridation treatment 160 is performed at a temperature of about 350° C. to about 500° C. for 30 sec to 300 sec. Moreover, the in-situ nitridation treatment 160 is performed using ammonia ($NH_3$) and nitrogen ($N_2$) as a process gas.

As shown in FIG. 15, after the in-situ nitridation treatment 160 is performed, a contact structure is formed in each of the contact openings 132 in accordance with some embodiments. For example, a fill metal material layer (not shown) that may be similar to or the same as the fill metal material layer 170 shown in FIG. 11 is formed to cover the insulating layer 130 and to fill the contact openings 132 in accordance with some embodiments. In those cases, the material and the formation of the fill metal material layer may be the same as or similar to those of the fill metal material layer 170 shown in FIG. 11.

Following the formation of the fill metal material layer, the fill metal material layer is planarized by a CMP process, but any other suitable polishing or etching back process may be used. As a result, a substantially planar surface is provided. The remaining fill metal material layer 170a in each of the contact openings 132 forms the contact structure that is in direct contact with the insulating layer 130 and the nitrogen-containing metal silicide or germanide layer 142a over the conductive region 122 (i.e., the raised epitaxial source/drain region).

Similarly, IMD layers may be formed over the insulating layer (i.e., the ILD layer) 130. A person of ordinary skill in the art will understand the additional processing that the structures in the figures may undergo, and hence, explicit discussion thereof is omitted herein for brevity.

Figure 16:
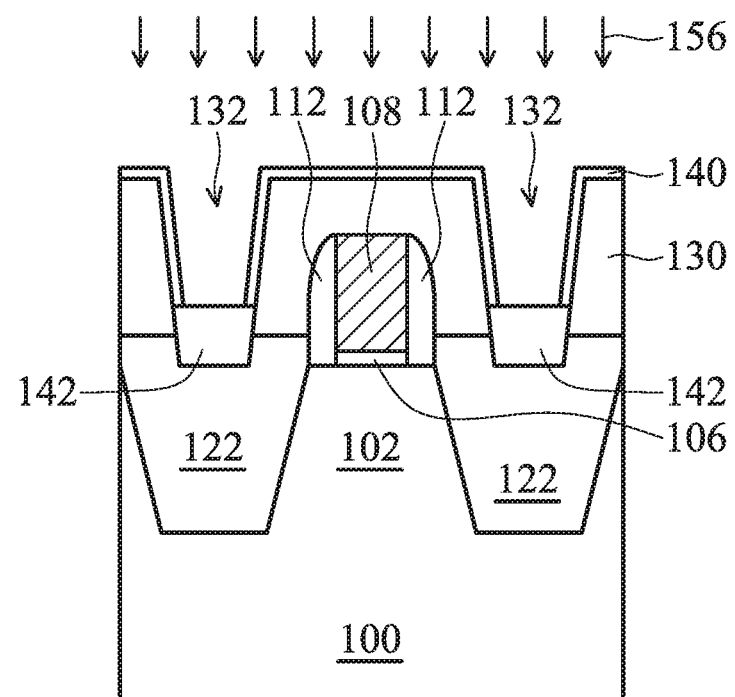
FIGS. 16 and 17 are cross-sectional views of various intermediate stages showing a method of forming the semiconductor device structure with a fin in accordance with some embodiments.
Figure 17:
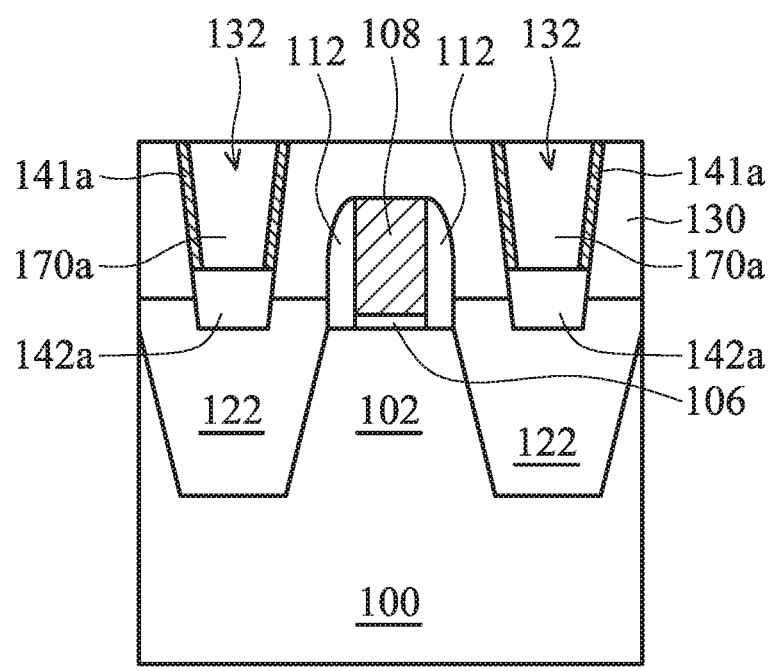

FIGS. 16 and 17 are cross-sectional views of various intermediate stages showing a method of forming the semiconductor device structure with a fin in accordance with some embodiments. Elements in FIGS. 16 and 17 that are the same as those in FIGS. 2, 3, 4, 5, 6, 7, 8, 9, 10, 11, and 12 are labeled with the same reference numbers as in FIGS. 2, 3, 4, 5, 6, 7, 8, 9, 10, 11, and 12 and may not be described again for brevity. As shown in FIG. 16, a structure as shown in FIG. 9 is provided and one or more cycle processes 156 that includes a deposition process for formation of the metal layer 140 (as shown in FIG. 8) and an in-situ etching process 150 (as shown in FIG. 9) is then performed to etch the metal layer 140 and increase the thickness of the metal silicide or germanide layer 142 in accordance with some embodiments.

In some embodiments, the cycle process 156 further includes an optional second in-situ etching process after the in-situ etching process 150 is performed, so that the metal layer 140 etched by the in-situ etching process 150 is thinned further. In those cases, the second in-situ etching process is similar to the in-situ etching process 150. For example, the second in-situ etching process is also performed using metal halide and hydrogen as a process gas, in which the flow rate of metal halide may be in a range from about 10 sccm to about 50 sccm and the flow rate of hydrogen may be in a range from about 10 sccm to about 500 sccm. Unlike the previous in-situ etching process 150, the second in-situ etching process is performed without applying plasma power.

In some embodiments, the number of the cycle process 156 is based on the desired thickness of the formed metal silicide or germanide layer 142. Namely, the cycle process 156 may be repeated until the thickness of the metal silicide or germanide layer 142 reach to a target thickness.

As shown in FIG. 17, after the cycle process 156 is performed, an in-situ nitridation treatment (not shown) is performed on the sidewall and the bottom of the contact opening 132 in accordance with some embodiments. As a result, a nitrogen-containing metal silicide or germanide layer 142a is formed over the bottom of each of the contact openings 132. At the same time, a liner (not shown) including a metal nitride region is also formed over the sidewall of each of the contact openings 132. In some embodiments, the metal nitride region is formed on the surface of the liner, so that the liner includes a metal (e.g., Ti) portion in direct contact with the sidewall of the contact openings 132. In some embodiments, the metal layer 140 formed after performing the cycle process 156 is entirely nitrided, such that the entire liner 141 forms a metal nitride (e.g., TiN) region. The formed liner may serve as an adhesion layer and a diffusion barrier layer for subsequent metal filling process. In some embodiments, the in-situ nitridation treatment may be similar to or the same as the in-situ nitridation treatment 160 (shown in FIG. 10). For example, the in-situ nitridation treatment is performed at a temperature of about 350° C. to about 500° C. for 30 sec to 300 sec. Moreover, the in-situ nitridation treatment 160 is performed using ammonia ($NH_3$) and nitrogen ($N_2$) as a process gas.

After the in-situ nitridation treatment is performed, a contact structure is formed in each of the contact openings 132 in accordance with some embodiments. For example, a fill metal material layer (not shown) that may be similar to or the same as the fill metal material layer 170 shown in FIG. 11 is formed to cover the insulating layer 130 and to fill the contact openings 132 in accordance with some embodiments. In those cases, the material and the formation of the fill metal material layer may be the same as or similar to those of the fill metal material layer 170 shown in FIG. 11.

Following the formation of the fill metal material layer, the fill metal material layer is planarized by a CMP process, but any other suitable polishing or etching back process may be used. As a result, a substantially planar surface is provided. The remaining liner 141a and the remaining fill metal material layer 170a in each of the contact openings 132 form the contact structure that is in direct contact with the insulating layer 130 and the nitrogen-containing metal silicide or germanide layer 142a over the conductive region 122 (i.e., the raised epitaxial source/drain region).

Similarly, IMD layers may be formed over the insulating layer (i.e., the ILD layer) 130. A person of ordinary skill in the art will understand the additional processing that the structures in the figures may undergo, and hence, explicit discussion thereof is omitted herein for brevity.

Embodiments of a semiconductor device structure and a method for forming the same are provided. The method for forming the semiconductor device structure includes providing a semiconductor substrate that includes a conductive region made of silicon, germanium or a combination thereof. In some embodiments, the semiconductor substrate has a fin and the conductive region is an epitaxial source/drain region in the fin. An insulating layer is formed over the semiconductor substrate and has an opening exposing the conductive region. A deposition process is performed to form a metal layer over a sidewall and the bottom of the opening, so that a metal silicide or germanide layer is formed on the exposed conductive region by the deposition process. In some embodiments, the deposition process includes CVD. An in-situ etching process is performed to thin the metal layer over the sidewall of the opening. In some embodiments, the metal layer in the opening is entirely removed by the in-situ etching process. Before a fill metal material layer is formed in the opening, an in-situ nitridation treatment is performed on the sidewall and the bottom of the opening, so as to form a liner including a metal nitride region over the sidewall of the opening and a nitrogen-containing metal silicide or germanide layer over the bottom of the opening.

According to the foregoing embodiments, since the metal layer in the opening is thinned by the in-situ etching process before the fill metal material layer is filled into the opening, the CD loss of the opening can be mitigated and thus a relatively larger volume of the fill metal material layer can be filled into the opening. As a result, the resistance of a contact structure formed of the metal material layer can be reduced and therefore the resistivity of source-drain contact ($R_{csd}$) is reduced.

According to the foregoing embodiments, since the metal deposition process including CVD provides excellent step coverage in the opening, the contact area between the metal layer and the exposed conductive region can be increased. As a result, the contact resistance between the conductive region and the fill metal material layer is reduced, so as to reduce the resistivity of source-drain contact ($R_{csd}$) further.

According to the foregoing embodiments, a self-aligned and nitrided liner and a nitrogen-containing metal silicide or germanide layer can be formed in the opening by the deposition process and the subsequent in-situ nitridation process, in which the liner may serve as an adhesion layer, a diffusion barrier layer, and an oxygen blocking layer and the silicide or germanide layer may be employed to reduce the contact resistance. Therefore, the process steps can be simplified. For example, there is no need to perform additional deposition processes for formation of the diffusion barrier layer. Moreover, there is no need to perform additional self-aligned silicide (salicide) process for formation of the silicide layer. As a result, the manufacture cost can be reduced.

In some embodiments, a method for forming a semiconductor device structure is provided. The method includes providing a semiconductor substrate that includes a conductive region made of silicon, germanium or a combination thereof. An insulating layer is formed over the semiconductor substrate. An opening is formed in the insulating layer to expose the conductive region. A deposition process is performed to form a metal layer over a sidewall and a bottom of the opening, so that a metal silicide or germanide layer is formed on the exposed conductive region by the deposition process. A first in-situ etching process is performed to etch at least a portion of the metal layer. A fill metal material layer is formed in the opening.

In some embodiments, a method for forming a semiconductor device structure is provided. The method includes providing a semiconductor substrate having a fin with an epitaxial source/drain region. The epitaxial source/drain region includes silicon, germanium or a combination thereof. An insulating layer is formed over the fin. A contact opening is formed in the insulating layer to expose the epitaxial source/drain region. A deposition process is performed to form a metal layer over a sidewall and a bottom of the opening, so that a metal silicide or germanide layer is formed on the exposed epitaxial source/drain region by the deposition process. A first in-situ etching process is performed using a metal halide as a process gas, so as to etch at least a portion of the metal layer. An in-situ nitridation treatment is performed on the sidewall and the bottom of the opening, so as to form a nitrogen-containing metal silicide or germanide layer over the bottom of the opening. A fill metal material layer is formed over the nitrogen-containing metal silicide or germanide layer and in the opening.

In some embodiments, a semiconductor device structure is provided. The semiconductor device structure includes a semiconductor substrate having a conductive region made of silicon, germanium or a combination thereof. An insulating layer overlies the semiconductor substrate. A fill metal material layer is in the insulating layer. A nitrogen-containing metal silicide or germanide layer is formed between the conductive region and the fill metal material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
providing a semiconductor substrate that comprises a conductive region made of silicon, germanium or a combination thereof;
forming an insulating layer over the semiconductor substrate;
forming an opening in the insulating layer to expose the conductive region;
performing a deposition process to form a metal layer over a sidewall and a bottom of the opening, so that a metal silicide or germanide layer is formed on the exposed conductive region by the deposition process;
performing a first in-situ etching process to etch at least a portion of the metal layer, so that the metal layer over the sidewall of the opening is partially removed such that a thinned metal layer remains over the sidewall of the opening; and
forming a fill metal material layer in the opening after the first in-situ etching process is performed.

2. The method as claimed in claim 1, further comprising performing an in-situ nitridation treatment on the sidewall and the bottom of the opening before forming the fill metal material layer and after performing the first in-situ etching process, so as to form a nitrogen-containing metal silicide or germanide layer over the bottom of the opening.

3. The method as claimed in claim 2, wherein a liner comprising a metal nitride region is formed over the sidewall of the opening by performing the in-situ nitridation treatment.

4. The method as claimed in claim 1, wherein plasma power is applied when the first in-situ etching process is performed.

5. The method as claimed in claim 4, further comprising performing a second in-situ etching process without applying plasma power after performing the first in-situ etching process.

6. The method as claimed in claim 5, wherein the metal layer is entirely etched by performing the second in-situ etching process.

7. The method as claimed in claim 1, wherein the first in-situ etching process is performed without applying plasma power.

8. The method as claimed in claim 7, wherein the metal layer is entirely etched by performing the first in-situ etching process.

9. The method as claimed in claim 1, further comprising performing at least one cycle process that comprises the deposition process and the first in-situ etching process prior to formation of the metal material.

10. A method of forming a semiconductor device structure, comprising:
providing a semiconductor substrate having a fin with an epitaxial source/drain region, wherein the epitaxial source/drain region comprises silicon, germanium or a combination thereof;
forming an insulating layer over the fin;
forming a contact opening in the insulating layer to expose the epitaxial source/drain region;
performing a deposition process to form a metal layer over a sidewall and the bottom of the opening, so that a metal silicide or germanide layer is formed on the exposed epitaxial source/drain region by the deposition process;
performing a first in-situ etching process using a metal halide as a process gas, so as to etch at least a portion of the metal layer;
performing an in-situ nitridation treatment on the sidewall and the bottom of the opening, so that the metal silicide or germanide layer is transformed to a nitrogen-containing metal silicide or germanide layer over the bottom of the opening; and forming a fill metal material layer in the opening and over the nitrogen-containing metal silicide or germanide layer that is formed by the in-situ nitridation treatment.

11. The method as claimed in claim 10, wherein a metal nitride region is formed over the sidewall of the opening after performing the in-situ nitridation treatment.

12. The method as claimed in claim 10, wherein plasma power is applied when the first in-situ etching process is performed.

13. The method as claimed in claim 12, further comprising performing a second in-situ etching process without applying plasma power after performing the first in-situ etching process, wherein the second in-situ etching process is performed using a metal halide as a process gas.

14. The method as claimed in claim 10, wherein the first in-situ etching process is performed without applying plasma power, wherein the metal layer is entirely etched by performing the first in-situ etching process.

15. The method as claimed in claim 10, further comprising performing at least one cycle process that comprises the deposition process and the first in-situ etching process before performing the in-situ nitridation treatment.

16. A method of forming a semiconductor device structure, comprising:
    forming a raised epitaxial source/drain region in a semiconductor substrate;
    forming an insulating layer over the semiconductor substrate, wherein the insulating layer comprises a contact opening to expose the raised epitaxial source/drain region;
    forming a metal silicide or germanide layer on the exposed raised epitaxial source/drain region in a bottom of the contact opening;
    transforming the metal silicide or germanide layer to a nitrogen-containing metal silicide or germanide layer; and
    forming a fill metal material layer in the contact opening and on the nitrogen-containing metal silicide or germanide layer that is transformed from the metal silicide or germanide layer.

17. The method as claimed in claim 16, further comprising:
    forming a metal layer over a sidewall of the contact opening before the metal silicide or germanide layer is formed; and
    thinning the metal layer over the sidewall of the contact opening after the metal silicide or germanide layer is formed.

18. The method as claimed in claim 16, wherein the raised epitaxial source/drain region is made of silicon, germanium or a combination thereof, and the metal silicide or germanide layer is formed and transformed by a cycle process comprising:
    depositing a metal layer over a sidewall and the bottom of the contact opening to contact the raised epitaxial source/drain region, so as to form the metal silicide or germanide layer; and
    etching the metal layer while increasing a thickness of the metal silicide or germanide layer by a first in-situ etching process.

19. The method as claimed in claim 18, wherein the cycle process further comprises thinning the metal layer by a second in-situ etching process, wherein the second in-situ etching process is performed without applying plasma power.

20. The method as claimed in claim 18, wherein the cycle process further comprises transforming the etched metal layer to a metal nitride region while transforming the metal silicide or germanide layer to the nitrogen-containing metal silicide or germanide layer by an in-situ nitridation process.

* * * * *